United States Patent
Brouk et al.

(10) Patent No.: US 7,822,565 B2
(45) Date of Patent: Oct. 26, 2010

(54) SYSTEM, METHOD, AND APPARATUS FOR MONITORING CHARACTERISTICS OF RF POWER

(75) Inventors: Victor Brouk, Fort Collins, CO (US); Jeff Roberg, Longmont, CO (US)

(73) Assignee: Advanced Energy Industries, Inc., Fort Collins, CO (US)

( * ) Notice: Subject to any disclaimer, the term of this patent is extended or adjusted under 35 U.S.C. 154(b) by 0 days.

(21) Appl. No.: 11/968,081

(22) Filed: Dec. 31, 2007

(65) Prior Publication Data
US 2009/0167290 A1 Jul. 2, 2009

(51) Int. Cl.
G01R 11/00 (2006.01)
(52) U.S. Cl. ............... 702/77; 702/75; 702/76; 702/81
(58) Field of Classification Search ............ 702/65, 702/77, 94, 141, 142, 150, 182, 188; 324/300; 360/51; 455/302, 313; 700/121
See application file for complete search history.

(56) References Cited

U.S. PATENT DOCUMENTS

| | | | | |
|---|---|---|---|---|
| 5,045,956 A | * | 9/1991 | Ejima | 360/51 |
| 5,059,915 A | * | 10/1991 | Grace et al. | 324/650 |
| 5,523,955 A | | 6/1996 | Heckman | |
| 6,046,594 A | | 4/2000 | Mavretic | |
| 6,194,898 B1 | * | 2/2001 | Magnuson et al. | 324/300 |
| 6,351,683 B1 | * | 2/2002 | Johnson et al. | 700/121 |
| 6,522,121 B2 | | 2/2003 | Coumou | |
| 6,707,255 B2 | | 3/2004 | Coumou | |
| 6,838,832 B1 | | 1/2005 | Howald | |
| 7,142,835 B2 | * | 11/2006 | Paulus | 455/302 |
| 2006/0170367 A1 | | 8/2006 | Bhutta | |

OTHER PUBLICATIONS

Kim, Ju Sik, "Written Opinion of the International Searching Authority", Jun. 30, 2009, Publisher: Korean Intellectual Property Office.
Discrete Fourier Transform, obtained from: http://en.wikipedia.org/wiki/Discrete_Fourier_transform; original publication date: unknown; site visited Sep. 10, 2009.

* cited by examiner

Primary Examiner—Carol S Tsai
Assistant Examiner—Felix E Suarez
(74) Attorney, Agent, or Firm—Neugeboren O'Dowd PC; Sean R. O'Dowd

(57) ABSTRACT

A system and method for monitoring RF power is described. In one embodiment the system samples RF power that is generated by an RF generator to obtain RF signals that include information indicative of electrical characteristics at a plurality of particular frequencies that fall within a frequency range. The RF signals are digitized to obtain a stream of digital RF signals that include information indicative of electrical characteristics at the plurality of particular frequencies, and the information indicative of electrical characteristics is successively transformed, for each of the plurality of particular frequencies, from a time domain into a frequency domain.

16 Claims, 5 Drawing Sheets

SYSTEM, METHOD, AND APPARATUS FOR MONITORING CHARACTERISTICS OF RF POWER

FIELD OF THE INVENTION

This invention relates generally to apparatus and methods for plasma processing, and more particularly to apparatus and methods for monitoring parameters of plasma processing systems.

BACKGROUND OF THE INVENTION

In plasma processing applications, such as the manufacture of semiconductors or flat panel displays, RF power generators apply a voltage to a load in a plasma chamber and may operate over a wide range of frequencies. Experience in the plasma-processing industry has been able to associate particular plasma parameters (e.g., ion density, electron density, and energy distribution) to characteristics (e.g., uniformity, film thickness, and contamination levels) of the processed material (e.g., wafer). In addition, a wealth of knowledge exists that connects wafer characteristics to overall quality; thus there is experience in the plasma process industry that associates plasma parameters to the quality of the overall processing.

Obtaining information about plasma parameters (e.g., by direct measurement of the plasma environment), however, is difficult and intrusive. In contrast, identifying electrical characteristics (e.g., voltage, current, impedance, power) of RF power that is applied to a plasma processing chamber is a relatively inexpensive way to obtain a large amount of information, but existing techniques for identifying electrical characteristics are either too expensive, too slow, or too inaccurate to provide a sufficient amount of information to establish a known and repeatable association between the electrical characteristics and plasma parameters.

In particular, the RF power delivered to a plasma chamber typically includes significant amounts of power at a relatively few discrete frequencies (e.g., less than 20 frequencies). Known monitoring techniques, however, analyze a broad range of frequencies (e.g., including frequencies that do not substantially affect the plasma parameters). And as a consequence, these known techniques are too slow or too inaccurate to provide a sufficient amount of information about the electrical characteristics of the relevant frequencies. Accordingly, a system and method are needed to address the shortfalls of present technology and to provide other new and innovative features.

SUMMARY OF THE INVENTION

Exemplary embodiments of the present invention that are shown in the drawings are summarized below. These and other embodiments are more fully described in the Detailed Description section. It is to be understood, however, that there is no intention to limit the invention to the forms described in this Summary of the Invention or in the Detailed Description. One skilled in the art can recognize that there are numerous modifications, equivalents and alternative constructions that fall within the spirit and scope of the invention as expressed in the claims.

The present invention can provide a system and method for monitoring electrical characteristics of RF power applied to a plasma load. In one exemplary embodiment, the present invention can include sampling RF power that is generated by an RF generator to obtain RF signals, the RF signals including information indicative of electrical characteristics at a plurality of particular frequencies that fall within a frequency range. The RF signals are digitized to obtain a stream of digital RF signals, the digital RF signals including the information indicative of electrical characteristics at the plurality of particular frequencies, and the information indicative of electrical characteristics is successively transformed, for each of the plurality of particular frequencies, from a time domain into a frequency domain.

In another embodiment the invention may be characterized as an apparatus for monitoring electrical characteristics RF power applied to a plasma load. The apparatus in this embodiment includes an analog to digital converter configured to digitize RF signals, which include information indicative of electrical characteristics that are generated by an RF generator, to provide a stream of digital RF signals that includes the information indicative of electrical characteristics; and a transform portion configured to successively transform, at each of a plurality of particular frequencies, the information indicative of electrical characteristics, from a time domain into a frequency domain.

In yet another embodiment, the invention may be characterized as method for monitoring electrical characteristics of RF power applied to a plasma load. The method in this embodiment includes receiving a substantially continuous stream of digital samples of a parameter of the RF power that is applied to the plasma load, the RF power including power at a plurality of frequencies within a frequency spectrum; synthesizing a sinusoidal function at a particular one of the plurality of frequencies; generating a plurality of products, each of the products being a product of the sinusoidal function and each of a plurality of the digital samples; and providing a normalized value of a sum of the products so as to provide a value of the parameter of the electrical characteristics at the particular one of the plurality of frequencies.

As previously stated, the above-described embodiments and implementations are for illustration purposes only. Numerous other embodiments, implementations, and details of the invention are easily recognized by those of skill in the art from the following descriptions and claims.

BRIEF DESCRIPTION OF THE DRAWINGS

Various objects and advantages and a more complete understanding of the present invention are apparent and more readily appreciated by reference to the following Detailed Description and to the appended claims when taken in conjunction with the accompanying Drawings wherein:

DETAILED DESCRIPTION

Figure 1:
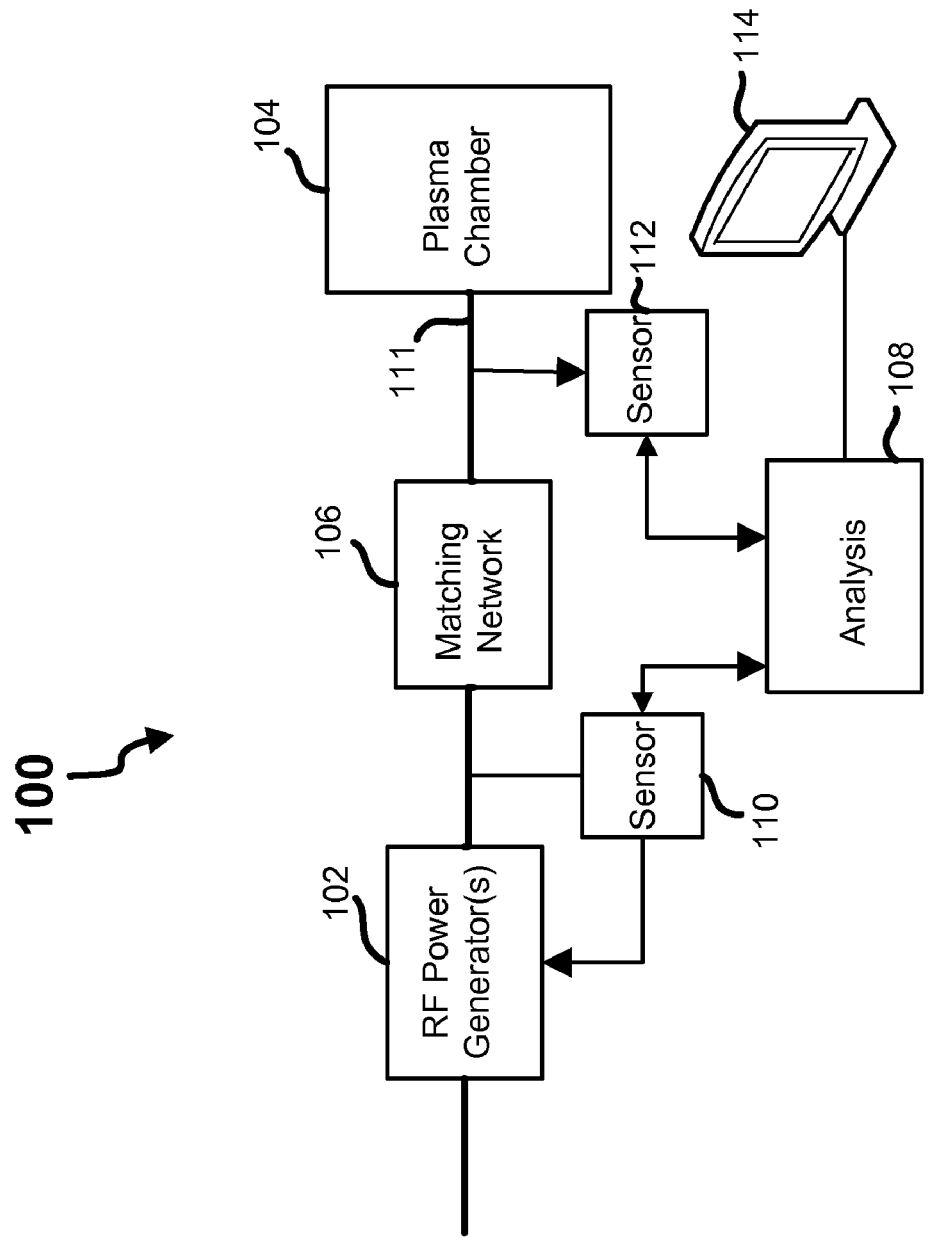
FIG. 1 is a block diagram depicting a plasma processing environment in which several embodiments of the invention are implemented.

Referring now to the drawings, where like or similar elements are designated with identical reference numerals throughout the several views, and referring in particular to FIG. 1, it is a block diagram depicting a plasma processing environment 100 in which several embodiments of the invention are implemented. As shown, a radio frequency (RF) generator 102 is coupled to a plasma chamber 104 via an impedance matching network 106, and an analysis portion 108 is disposed to receive an input from a first sensor 110 that is coupled to an output of the RF generator 102 and in input from a second sensor 112 that is coupled to an input of the plasma chamber 104. As depicted, the analysis portion 108 is also coupled to a man-machine interface 114, which may include a keyboard, display and pointing device (e.g., a mouse).

The illustrated arrangement of these components is logical and not meant to be an actual hardware diagram; thus, the components can be combined or further separated in an actual implementation. For example, the functionality of one or both of the sensors 110, 112 may be implemented with components of the analysis portion 108, and the sensor 110 may be entirely contained within a housing of the generator 102. Moreover, it should be recognized that the components included in FIG. 1 depict an exemplary implementation, and in other embodiments, as discussed further herein, some components may be omitted and/or other components added.

The RF power generator 102 generally provides RF power to the plasma chamber 104 to ignite and sustain a plasma in the chamber 104 for plasma processing. Although not required, in many embodiments the RF generator 102 is realized by a collection of two or more RF generators, and each of the RF generators provides power at a different frequency. Although certainly not required, the RF generator 102 may be realized by one or more PARAMOUNT model RF generators available from Advanced Energy Incorporated in Fort Collins, Colo.

The matching network 106 in this embodiment is generally configured to transform the chamber impedance, which can vary with the frequency of this applied voltage, chamber pressure, gas composition, and the target or substrate material, to an ideal load for the RF power generator 102. One of ordinary skill in the art will appreciate that a variety of different matching network types may be utilized for this purpose. The matching network 106 may be realized by a NAVIGATOR model digital impedance matching network available from Advanced Energy Incorporated in Fort Collins, Colo., but other impedance matching networks may also be utilized.

The first sensor 110 in this embodiment is generally configured to close feedback to the RF generator 102 so as to enable the RF generator 102 to maintain a desired level of output power (e.g., a constant output power). In one embodiment for example, the sensor 110 measures a parameter of the electrical characteristics applied by the generator (e.g., reflected power, reflection coefficient, etc.) and provides feedback to the RF power generator 102 based upon a difference between the measured parameter and a setpoint.

The second sensor 112 in the embodiment depicted in FIG. 1 is generally configured to provide a characterization of the plasma in the chamber 104. For example, measurements taken by the sensor 112 may be used to estimate ion energy distribution, electron density, and/or energy distribution, which directly impact results of the processing in the chamber 104. In many embodiments, by way of further example, electrical characteristics (e.g., voltage, current, impedance) measured at an input 111 to the chamber 104 can be used to predict values of associated plasma parameters, and may be used for end-point detection. For example, measurements from the second sensor 112 may be used in connection with known information (e.g., information indicating how a deviation from a particular voltage would, or would not, affect one or more plasma parameter(s)). Although not depicted in FIG. 1, the sensors 110, 112 may include a transducer, electronics, and processing logic (e.g., instructions embodied in software, hardware, firmware or a combination thereof).

The analysis portion 108 is generally configured to receive information (e.g., information about parameters of electrical characteristics) from the sensors 110, 112 and convey the information to a user via the man-machine interface 114. The analysis portion 108 may be realized by a general purpose computer in connection with software, or dedicated hardware and/or firmware.

Figure 2:
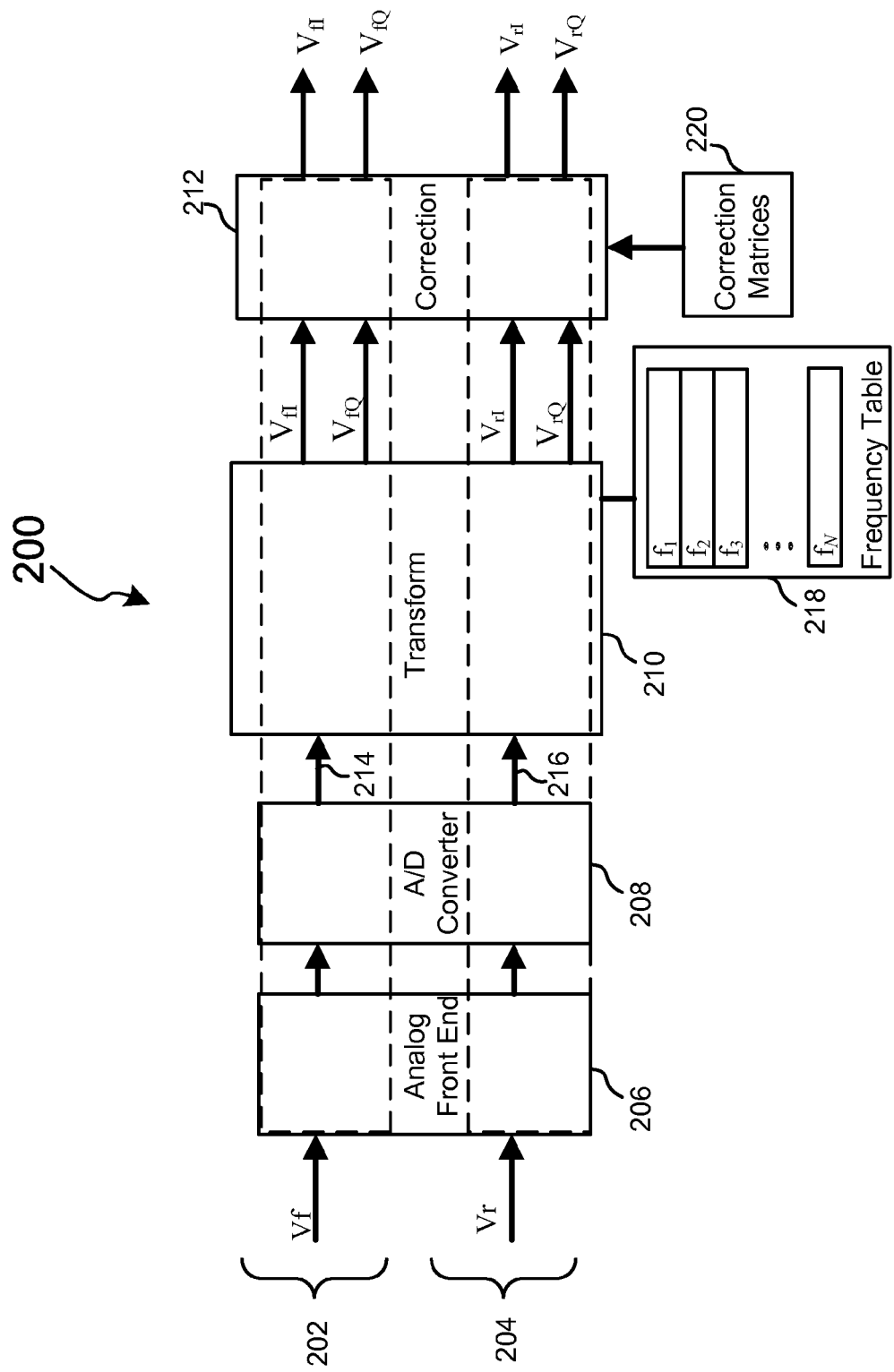
FIG. 2 is a block diagram depicting an exemplary embodiment of a processing portion of the sensors described with reference to FIG. 1.

Referring next to FIG. 2, shown is an exemplary embodiment of a processing portion 200 of the sensors 110, 112 described with reference to FIG. 1. As shown, the processing portion 200 in this embodiment includes a first and second processing chains 202, 204, and each processing chain 202, 204 includes an analog front end 206, an analog to digital (A/D) converter 208, a transform portion 210, and a correction portion 212.

The depiction of components in FIG. 2 is logical and not meant to be an actual hardware diagram; thus, the components can be combined or further separated in an actual implementation. For example, the A/D converter 208 may be realized by two separate A/D converters (e.g., 14 bit converters), and the transform portion 210 may be realized by a collection of hardware, firmware, and/or software components. In one particular embodiment for example, the transform and correction portions 210, 212 are realized by a field programmable gate array.

In the exemplary embodiment depicted in FIG. 2, the first and second processing chains 202, 204 are configured to receive respective forward-voltage and reverse-voltage analog-RF signals (e.g., from a directional coupler, which may be referred to as a forward and reflected wave sensor). In other embodiments the first and second processing chains 202, 204 may receive voltage and current analog-RF signals. For clarity, the operation of the processing portion 200 is described with reference to a single processing chain, but it should be recognized that corresponding functions in a second processing chain are carried out.

Figure 3:
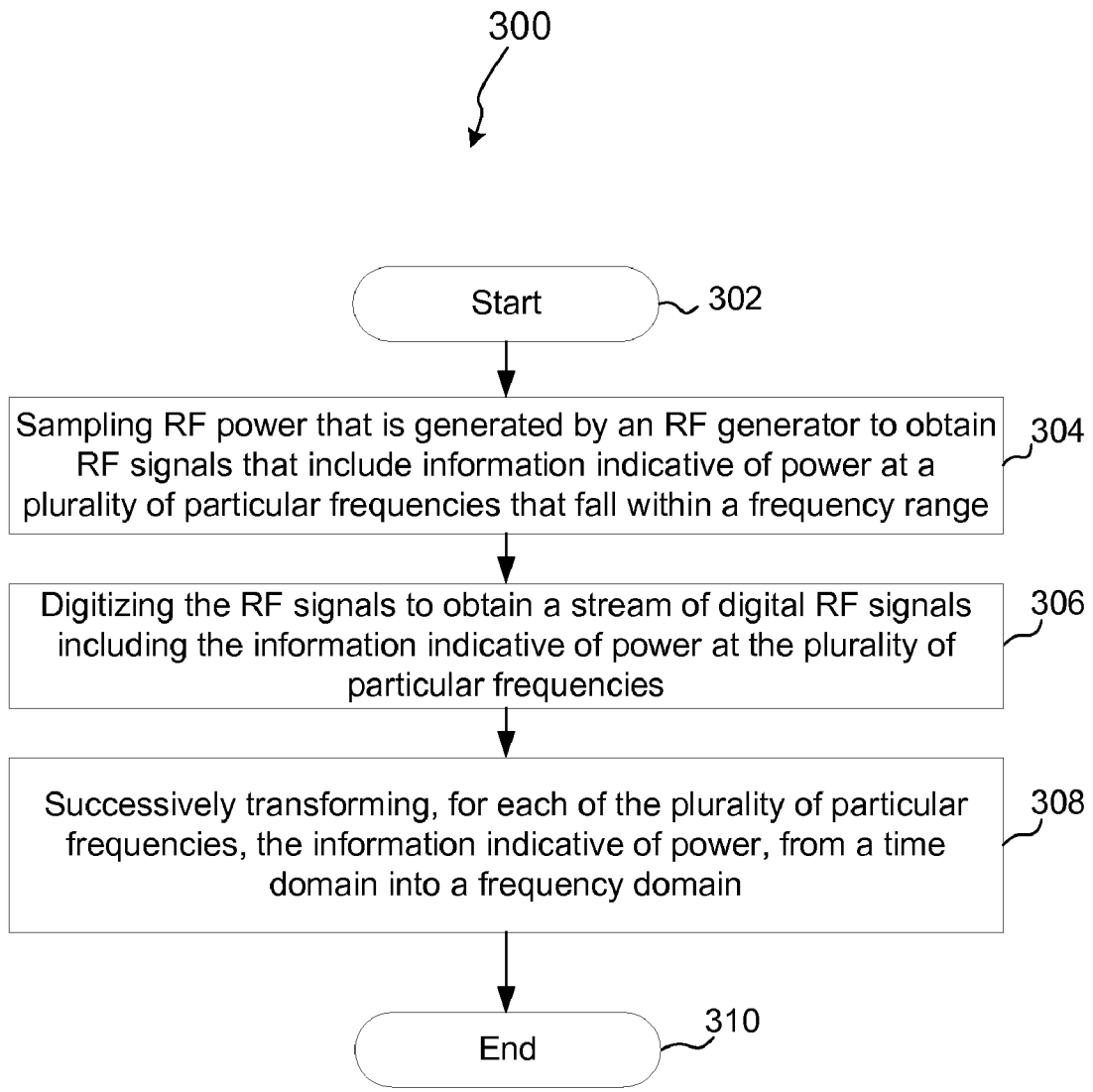
FIG. 3 is a flowchart that depicts an exemplary method for monitoring power that is applied to a plasma load.

While referring to FIG. 2, simultaneous reference will be made to FIG. 3, which is a flowchart 300 that depicts an exemplary method for monitoring electrical characteristics of power that is applied to a plasma load. It should be recognized, however, that the method depicted in FIG. 3 is not limited to the specific embodiment depicted in FIG. 2. As shown in FIG. 3, RF power that is generated by an RF generator (e.g., the RF generator 102) is sampled to obtain RF signals that include information indicative of electrical characteristics at a plurality of particular frequencies that fall within a frequency range (Blocks 300, 302).

For example, the frequency range may include the range of frequencies from 400 kHz to 60 MHz, but this range may certainly vary depending upon, for example, the frequencies of the RF generator(s) that provide power to the system. The plurality of particular frequencies may be frequencies of a particular interest, and these frequencies, as discussed further herein, may also vary depending upon the frequencies of power that are applied to a processing chamber (e.g., processing chamber 104). For example, particular frequencies may be fundamental frequencies, second and third harmonics of each of the frequencies; and intermodulation products.

As shown with reference to FIG. 2, the analog front end 206 of the first processing chain 202 is configured to receive a forward-voltage analog-RF signal from a transducer (not shown) and prepare the analog RF signal for digital conversion. The analog front end 206, for example, may include a voltage divider and prefilter. As shown, once the analog-RF signal is processed by the analog front end 206, it is digitized by the A/D converter 208 to generate a stream of digital RF signals that includes the information indicative of electrical characteristics at the plurality of particular frequencies (Block 306). In some embodiments for example, 64 million samples are taken of the analog-RF signal per second with 14-bit accuracy.

As shown, once the sampled RF signals are digitized, the information indicative of electrical characteristics (in digital form) is successively transformed, for each of the plurality of particular frequencies, from a time domain into a frequency domain (Block 308). As an example, the transform portion 210 depicted in FIG. 2 receives the streams of digital RF signals 214, 216 and successively transforms the information in each of the digital streams 214, 216 from a time domain to a frequency domain, and provides both in-phase and quadrature information for both the forward voltage stream and the reflected voltage steam.

Although not required, the transform portion 210 in some embodiments is realized by a field programmable gate array (FPGA), which is programmed to carry out, at a first moment in time, a Fourier transform (e.g., a single frequency Fourier coefficients calculation) at one frequency, and then carry out a Fourier transform, at a subsequent moment in time, at another frequency so that Fourier transforms are successively carried out, one frequency at a time. Beneficially, this approach is faster and more accurate than attempting to take a Fourier transform over the entire range of frequencies (e.g., from 400 kHz to 60 MHz) as is done in prior solutions.

In the embodiment depicted in FIG. 2, the particular frequencies $f_{1-N}$ at which successive transforms of the digital RF signals are taken are stored in a table 218 that is accessible by the transform portion 210. In variations of this embodiment, a user is able to enter the particular frequencies $f_{1-N}$ (e.g., using the man-machine interface 114 or other input means). The particular frequencies $f_{1-N}$ entered may be frequencies of interest because, for example, the frequencies affect one or more plasma parameters. As an example, if two frequencies are applied to a chamber (e.g., utilizing two generators), there may be 8 frequencies of interest: the two fundamental frequencies; the second and third harmonics of each of the frequencies; and the two intermodulation products of the two frequencies.

In some embodiments, 256 samples of each of the digital streams 214, 216 are utilized to generate a Fourier transform, and in many embodiments the data rate of the digital streams 214, 216 is 64 Mbs. It is contemplated, however, that the number of samples may be increased (e.g., to improve accuracy) or decreased (e.g., to increase the rate at which information in the streams is transformed). Beneficially, in many implementations of the transform portion 210, the digital streams 214, 216 are continuous data streams (e.g., there is no buffering of the data) so that a transform, at each of the particular frequencies (e.g., frequencies $f_{1-N}$) is quickly carried out (e.g., every micro second).

As shown in the embodiment depicted in FIG. 2, the transform portion 210 provides two outputs (e.g., in phase information (I) and quadrature information (Q)) for each of the digital forward and reflected voltage streams 214, 216, and each of the four values are then corrected by the correction portion 212. As depicted in FIG. 2, in some embodiments, correction matrices 220 are utilized to correct the transformed information from the transform portion 210. For example, each of the four values provided by the transform portion 210 are multiplied by a correction matrix that is stored in memory (e.g., non-volatile memory).

In many embodiments the matrices 220 are the result of a calibration process in which known signals are measured and correction factors are generated to correct for inaccuracies in a sensor. In one embodiment, the memory includes one matrix for each of 125 megahertz, and each of the matrices is a 2×4 matrix. And in variations, a separate matrix is used for each of impedance and power; thus 250, 2×4 matrices are utilized in some variations. As shown, after correction by the correction portion 212, four outputs, representing corrected in-phase and quadrature representations of forward and reflected voltage are output.

In some embodiments, a look-up table (e.g., of sine and cosine functions) is utilized to carry out a Fourier transform in the transform portion 210. Although Fourier transforms may be carried out relatively quickly using this methodology, the amount of stored data may be unwieldy when a relatively high accuracy is required.

Figure 4:
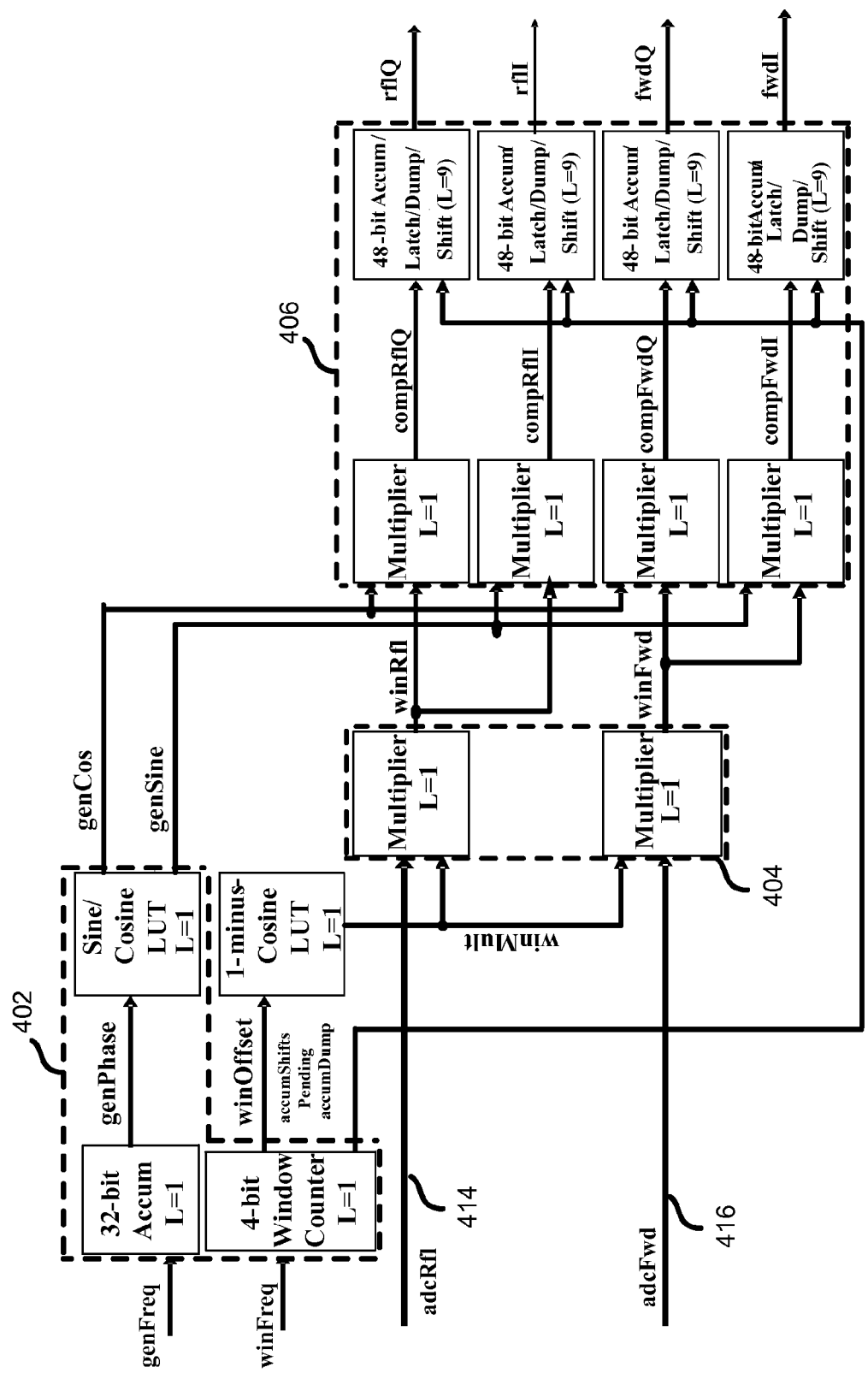
FIG. 4 is a block diagram depicting an exemplary embodiment of the transform portion depicted in FIG. 2.

In other embodiments, direct digital synthesis (DDS) is utilized in connection with the transform of data. Referring to FIG. 4, for example, it is a block diagram depicting an exemplary embodiment of the transform portion 210 depicted in FIG. 2. While referring to FIG. 4, simultaneous reference will be made to FIG. 5, which is a flowchart depicting an exemplary method for performing a transform of sampled RF data. As shown, in the exemplary embodiment depicted in FIG. 4, a particular frequency is selected (e.g., one of the particular frequencies $f_{1-N}$ described with reference to FIG. 2) (Blocks 500, 502), and a direct digital synthesis portion 402 synthesizes a sinusoidal function for the frequency (Block 504). In the embodiment depicted in FIG. 4, for example, both a sine and a cosine function are synthesized.

Figure 5:
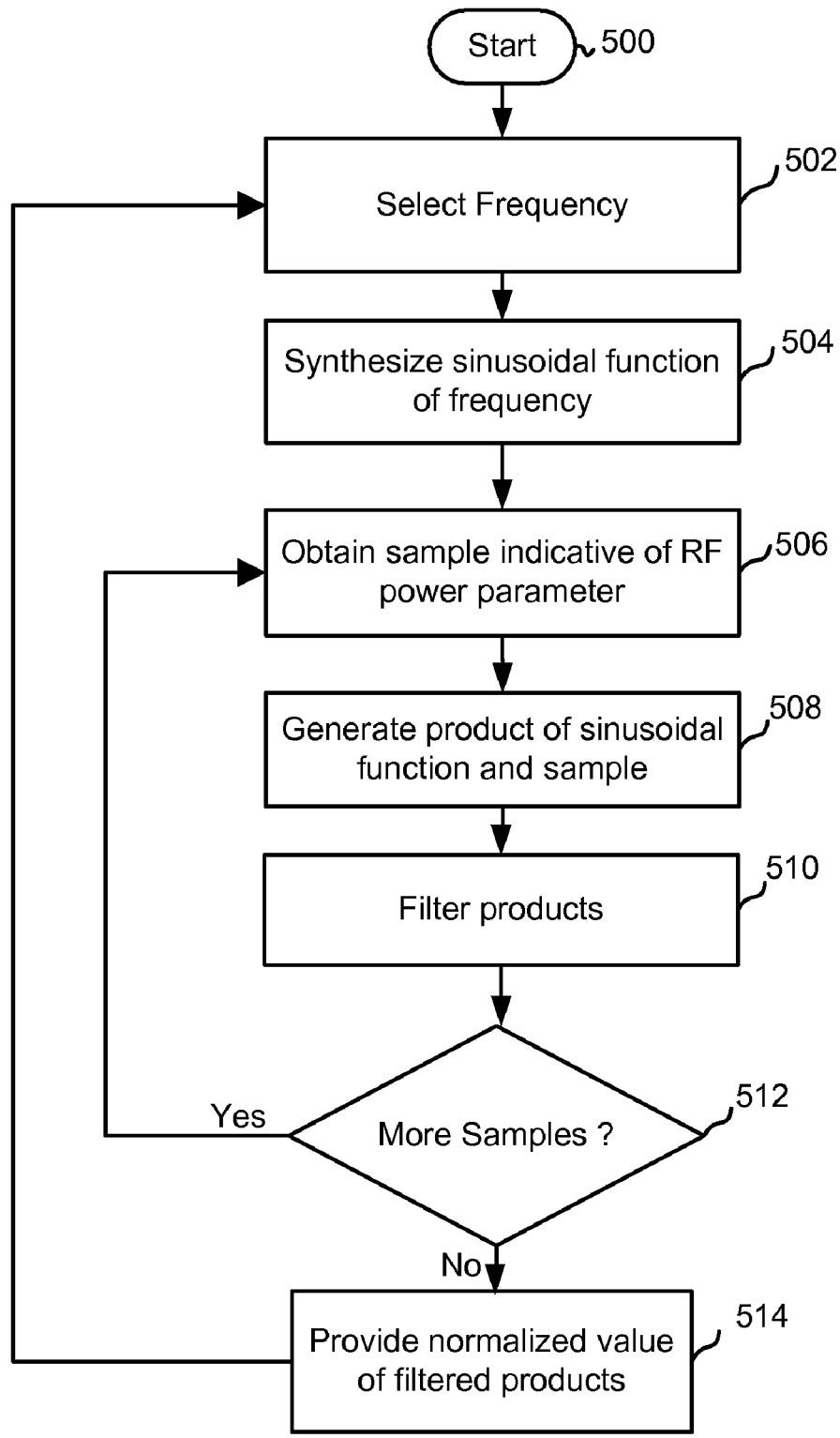
FIG. 5 is a flowchart depicting an exemplary method for performing a transform of sampled RF data.

As shown, a sample indicative of an RF power parameter is obtained (Block 506). In the exemplary embodiment depicted in FIG. 4, digital samples 414, 416 of both forward and reflected voltage are obtained, but in other embodiments other parameters are obtained (e.g., voltage and current). As shown in FIG. 5, for each selected frequency, products of the sinusoidal function at the selected frequency and multiple samples of the RF data are generated (Block 508). In the embodiment depicted in FIG. 4 for example, after a windowing function 404 is carried out on the digital RF samples 414, 416 (e.g., obtained from the A/D converter), the sine and cosine functions generated by the DDS 402 are multiplied by each sample by multipliers in a single-frequency-Fourier-coefficients-calculation (SFFCC) portion 406.

As shown, the products of the sinusoidal function and the samples are filtered (Block 510) (e.g., by accumulators in the (SFFCC) 406), and once a desired number of digital RF samples are utilized (Block 512), a normalized value of the filtered products is provided (Block 514). In some embodiments 64 samples are utilized and in other embodiments 256 are utilized, but this is certainly not required, and one of ordinary skill in the art will recognize that the number of samples may be selected based upon a desired bandwidth and response of the filter. In yet other embodiments other numbers of digital RF samples are utilized to obtain the value of a parameter (e.g., forward or reflected voltage) at a particular frequency.

As shown in FIG. 5, for each particular frequency (e.g., each of the N frequencies in table 218) Blocks 502-514 are carried out so that a transforms of the sampled RF data are successively carried out for each frequency of interest. In one embodiment, the DDS 402, windowing 404 and the SFFCC 406 portions are realized by an FPGA. But this is certainly not required, and in other embodiments the DDS portion 402 is realized by dedicated chip and the windowing 404 and SFFCC 406 portions are implemented separately (e.g., by an FPGA).

In conclusion, the present invention provides, among other things, a system and method for monitoring electrical characteristics of RF power. Those skilled in the art can readily recognize that numerous variations and substitutions may be made in the invention, its use and its configuration to achieve substantially the same results as achieved by the embodiments described herein. Accordingly, there is no intention to limit the invention to the disclosed exemplary forms. Many variations, modifications and alternative constructions fall within the scope and spirit of the disclosed invention as expressed in the claims.

What is claimed is:

1. A method for monitoring electrical characteristics of RF power applied to a plasma load in a plasma chamber comprising:
    sensing electrical characteristics of RF power that is generated by an RF generator to obtain RF signals, the RF signals including information indicative of electrical characteristics at a plurality of particular ones of frequencies that fall within a frequency range, wherein the plurality of particular ones of frequencies include at least:
        a fundamental frequency of the RF power;
        a second harmonic of the fundamental frequency of the RF power; and
        a third harmonic of the fundamental frequency of the RF power;
    digitally sampling the RF signals to obtain a stream of digital RF signals, the digital RF signals including the information indicative of electrical characteristics at the plurality of particular ones of frequencies; and
    successively performing, for each of the plurality of particular ones of frequencies, a single-frequency transform on the information indicative of electrical characteristics, from a time domain into a frequency domain so as to obtain a quantity of information that enables an association to be made between the electrical characteristics at the particular ones of frequencies and plasma parameters that are indicative of characteristics of material that is being processed in the plasma chamber.

2. The method of claim 1 wherein successively performing includes transforming only the information indicative of electrical characteristics at the particular ones of frequencies so as to leave frequency bands between the particular ones of frequencies untransformed.

3. The method of claim 1, wherein sampling includes sampling with a sensor selected from the group consisting of a voltage-current sensor and a directional coupler.

4. The method of claim 1, wherein the information indicative of electrical characteristics includes forward and reverse voltage information.

5. The method of claim 1, wherein successively performing includes:
    digitally synthesizing a sinusoidal function at each of the particular ones of frequencies; and
    filtering, for each of the particular ones of frequencies, products of the sinusoidal function and sampled values of the information indicative of electrical characteristics so as to obtain a transform of the information indicative of electrical characteristics for each of the plurality of particular ones of frequencies.

6. The method of claim 1, wherein successively performing includes:
    retrieving a pre-created sinusoidal function from a table of sinusoidal functions for each of the particular frequencies; and
    filtering, for each of the particular frequencies, products of the sinusoidal function and sampled values of the information indicative of electrical characteristics so as to obtain a transform of the information indicative of electrical characteristics for each of the plurality of particular frequencies.

7. The method of claim 1 wherein digitizing the RF signals includes digitizing the RF signals to obtain a 14 bit stream of digital RF signals at 64 Mbs.

8. The method of claim 1, wherein successively performing includes transforming a stream of continuous digital RF signals.

9. The method of claim 1, including:
    selecting the plurality of particular ones of frequencies;
    placing indicators of the selected frequencies in a table; and
    accessing the table so as to identify the plurality of particular ones of frequencies to be successively transformed.

10. An apparatus for monitoring RF power applied to a plasma load in a plasma processing chamber comprising:
    a sensor configured to sense electrical characteristics of the RF power applied to the plasma load and provide analog information indicative of the electrical characteristics that are generated by an RF generator;
    an analog to digital converter configured to digitize the analog information indicative of electrical characteristics that are generated by the RF generator, to provide a stream of digital RF signals that includes the information indicative of electrical characteristics;
    a transform portion configured to receive the stream of digital RF signals and successively perform a single-frequency transform of the information indicative of electrical characteristics, from a time domain into a frequency domain, at each of a fundamental frequency of the RF power, a second harmonic of the fundamental frequency of the RF power, and a third harmonic of the fundamental frequency of the RF power; and
    a correction portion configured to apply correction factors to the transformed information indicative of electrical characteristics so as to correct for inaccuracies in the sensor, wherein the corrected and transformed information characterizes the plasma in the plasma processing chamber.

11. The apparatus of claim 10, wherein the transform portion is configured to transform only the information indicative of electrical characteristics at least eight particular frequencies.

12. The apparatus of claim 10, wherein the transform portion is configured to perform a fast Fourier transform.

13. The apparatus of claim 10, wherein the analog to digital converter provides a substantially continuous stream of digital RF signals so as to enable the transform portion to transform the information indicative of electrical characteristics in substantially real time.

14. The apparatus of claim 10, wherein the transform portion includes:
    a direct digital synthesizer configured to synthesize a sinusoidal function at the fundamental frequency;
    a digital multiplier to generate products of the sinusoidal function and each of a plurality of sampled values of the information indicative of electrical characteristics so as to generate a first plurality of products; and
    a filter portion configured to sum the first plurality of products so as to provide a first product sum, wherein a normalized value of the first product sum provides a value of a parameter at the fundamental frequency.

15. The apparatus of claim 14, wherein subsequent to the direct digital synthesizer generating a sinusoidal function at the first of the particular frequencies, the direct digital synthesizer is configured to synthesize a sinusoidal function at a second of the particular frequencies, the multiplier generates products of the second frequency and each of a plurality of additional sampled values of the information indicative of electrical characteristics so as to generate a second plurality of products, and the accumulator sums the second plurality of products so as to provide a second product sum, wherein a normalized value of the second product sum provides a value of a parameter at the second of the particular frequencies.

16. The apparatus of claim 14, wherein the direct digital synthesizer is implemented with a field programmable gate array.

* * * * *